US008803285B2

(12) United States Patent
Ohtake et al.

(10) Patent No.: US 8,803,285 B2
(45) Date of Patent: Aug. 12, 2014

(54) SEMICONDUCTOR DEVICE CAPABLE OF REDUCING INTERELECTRODE LEAK CURRENT AND MANUFACTURING METHOD THEREOF

(75) Inventors: Hiroto Ohtake, Tokyo (JP); Naoya Inoue, Tokyo (JP); Ippei Kume, Tokyo (JP); Takeshi Toda, Kanagawa (JP); Yoshihiro Hayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 722 days.

(21) Appl. No.: 11/745,673

(22) Filed: May 8, 2007

(65) Prior Publication Data
US 2007/0262417 A1 Nov. 15, 2007

(30) Foreign Application Priority Data
May 9, 2006 (JP) ................................. 2006-130083

(51) Int. Cl.
*H01L 29/00* (2006.01)
(52) U.S. Cl.
USPC ........... 257/532; 257/301; 257/306; 257/295; 257/534; 257/E27.001
(58) Field of Classification Search
USPC ........................................ 257/532; 361/303.6
See application file for complete search history.

(56) References Cited

U.S. PATENT DOCUMENTS

| 4,931,897 A * | 6/1990 | Tsukamoto et al. ........... 361/313 |
| 6,335,551 B2 * | 1/2002 | Takemura ..................... 257/306 |
| 2003/0011043 A1 * | 1/2003 | Roberts ......................... 257/532 |
| 2003/0190808 A1 * | 10/2003 | Kim et al. ..................... 438/689 |
| 2004/0166627 A1 * | 8/2004 | Lim et al. ..................... 438/241 |
| 2005/0062130 A1 * | 3/2005 | Ciancio et al. ............... 257/532 |
| 2006/0171098 A1 * | 8/2006 | Won .......................... 361/306.3 |
| 2007/0235880 A1 * | 10/2007 | Yang ............................ 257/773 |
| 2007/0291441 A1 | 12/2007 | Inoue et al. |

FOREIGN PATENT DOCUMENTS

| JP | 2002-43529 A | 2/2002 |
| JP | 2002-203915 A | 7/2002 |
| JP | 2004-134451 A | 4/2004 |
| JP | 2004-221446 A | 8/2004 |
| WO | 2006/001349 A1 | 1/2006 |

OTHER PUBLICATIONS

Communication from the Japanese Patent Office dated Feb. 8, 2012, in a counterpart application No. 2006-130083.

* cited by examiner

*Primary Examiner* — Victor A Mandala
*Assistant Examiner* — William Harriston
(74) *Attorney, Agent, or Firm* — Sughrue Mion, PLLC (57) ABSTRACT

A semiconductor device has a capacitive structure formed by sequentially layering, on a wiring or conductive plug, a lower electrode, a capacitive insulation film, and an upper electrode. The semiconductor device has, as the capacitive structure, a thin-film capacitor having a lower electrode structure composed of an amorphous or microcrystalline film or a laminate of these films formed on a polycrystalline film.

15 Claims, 12 Drawing Sheets

SEMICONDUCTOR DEVICE CAPABLE OF REDUCING INTERELECTRODE LEAK CURRENT AND MANUFACTURING METHOD THEREOF

This application claims priority to prior application JP 2006-130083, the disclosure of which is incorporated herein by reference.

FIELD OF THE INVENTION

The present invention relates to a semiconductor device having a thin-film capacitor on a multilayer wiring structure or within a multilayer wiring structure, and also relates to a manufacturing method thereof.

DESCRIPTION OF RELATED ART

In a conventional capacitor for high-frequency devices or decoupling capacitor, polysilicon is used for both upper and lower electrodes of the capacitor. In this type of capacitor, a PIP (polysilicon electrode/insulation film/polysilicon electrode) structure using an ONO (silicon oxide film/silicon nitride film/silicon oxide film) is employed as a capacitor insulation film. There is also conventionally provided an MOS (polysilicon electrode/gate silicon oxide film/silicon substrate) capacitor. However, those electrodes using polysilicon have problems such as high electrode resistance and occurrence of depletion in the electrodes. Therefore, electrodes having an MIM (metal/capacitor insulation film/metal) structure are being put to practical use, in which a metal or conductive metal oxide such as titanium nitride or ruthenium oxide is used for the electrodes.

To cope with the demand for increased capacity and decreased area of thin-film capacitors, it has been studied to use an MIM structure using a silicon nitride film (SiN) as an insulation film, in place of the conventional insulation film structure using the ONO structure or a gate oxide film.

There has recently arisen a demand for reducing the thickness of an SiN film to 20 nm or less in order to increase the capacity density of the MIM structure to 5 fF/$\mu m^2$ or more. Therefore, it becomes important to control the surface physical properties of the lower electrode which is an underlayer film for growing the SiN film.

According to the studies so far, a titanium nitride film is a prospective candidate for the electrode of the MIM structure. However, since a titanium nitride film tends to be formed of polycrystals having a columnar structure, the surface of the lower electrode likely has large roughness (irregularity). This roughness prevents the capacitor insulation film from being formed in a uniform thickness over the whole surface of the lower electrode, and causes problems such as large leakage or short-circuit between the upper and lower electrodes. Particularly, when the thickness of the capacitive insulation film is reduced to increase the capacity per unit area, the roughness of the lower electrode surface noticeably deteriorates the insulation quality of the capacitive insulation film. One example of the methods for suppressing the roughness of the lower electrode surface is disclosed in Japanese Laid-Open Patent Publication No. 2002-203915, which proposes to perform planarization processing with the use of a material obtained by chemical or mechanical polishing after formation of a titanium nitride film lower electrode.

As described above, if a polycrystalline film such as a titanium nitride film is directly used as the lower electrode of the capacitor, the roughness of the lower electrode surface tends to cause problems such as short-circuit or leakage in the capacitor. The roughness of the lower electrode surface induces increase of leak current in the SiN capacitive insulation film which is particularly required to be extremely thin.

SUMMARY OF THE INVENTION

The present invention is to provide a semiconductor device including a thin-film capacitor having high yield and low interelectrode leak current.

A semiconductor device according to the present invention has a capacitive structure formed by sequentially layering, on a wiring or conductive plug, a lower electrode, a capacitive insulation film, and an upper electrode.

According to an aspect of the present invention, the semiconductor device has, as the capacitive structure, a thin-film capacitor having a lower electrode structure composed of an amorphous or microcrystalline film or a laminate of these films formed on a polycrystalline film.

Specifically, when a silicon nitride (SiN) film or an insulation film composed of primarily silicon nitride is used as the capacitive insulation film, a tantalum film or a nitrogen containing tantalum or tantalum nitride film is used as the amorphous or microcrystalline film. Alternatively, these films may be layered into a laminate. The polycrystalline film may be of any material that is compatible with a silicon LSI process and has low resistivity, for example may be a titanium nitride film. This is because if the specific resistance of the polycrystalline film is lower than that of the amorphous or microcrystalline film, the CR-time constant of the lower electrode becomes low and an MIM capacitor having excellent high-frequency responsiveness can be obtained. The upper electrode formed on the SiN film may be formed of a single layer since the coatability of the SiN film is not affect thereby.

According to another aspect of the present invention, the following manufacturing methods of a semiconductor device are provided.

First example of the manufacturing method comprises the steps of forming an insulation film on a wiring and forming an opening in the insulation film. The manufacturing method further comprises the steps of forming a polycrystalline film in and around the opening while depositing an amorphous or microcrystalline film on the formed polycrystalline film to form a lower electrode, and sequentially forming a capacitive insulation film and an upper electrode thereon. The manufacturing method still further comprises etching the upper electrode, the capacitive insulation film, and the lower electrode by using a photoresist corresponding to the upper electrode as a mask, and forming an upper-layer via and an upper-layer wiring on the structure thus obtained.

Second example of the manufacturing method comprises the steps of forming an insulation film on a wiring, forming a polycrystalline film on the insulation film while depositing an amorphous or microcrystalline film on the formed polycrystalline film to form a lower electrode, and sequentially forming a capacitive insulation film and an upper electrode thereon. The manufacturing method further comprises processing the upper electrode by using a photoresist pattern corresponding to the upper electrode as a mask, processing the lower electrode by using a photoresist pattern corresponding to the lower electrode as a mask, and forming an upper-layer via and an upper-layer wiring on the structure thus obtained.

Third example of the manufacturing method comprises the steps of forming an insulation film on a wiring, sequentially forming a polycrystalline film and an amorphous or microcrystalline film to form a lower electrode on the insulation film, then sequentially forming a capacitive insulation film and an upper electrode thereon, and further forming a first inorganic hard mask film. The manufacturing method further comprises transferring a photoresist pattern corresponding to the upper electrode onto the first hard mask film, processing the upper electrode by using the first hard mask film as a mask and then forming a second inorganic hard mask film, transferring a photoresist pattern corresponding to the lower electrode onto the second hard mask film, and processing the lower electrode by using the second hard mask film as a mask, and forming an upper-layer via and an upper-layer wiring on the structure thus obtained.

Fourth example of the manufacturing method comprises the steps of forming an insulation film on a wiring, providing an opening in the insulation film, depositing and polishing an electrical conductive material to form a conductive plug buried in the opening, depositing a polycrystalline film on the conductive plug, depositing an amorphous or microcrystalline film on the polycrystalline film to form a lower electrode, and then forming a capacitive insulation film and an upper electrode. The manufacturing method further comprises etching the upper electrode, the capacitive insulation film, and the lower electrode by using 10 a photoresist pattern corresponding to the upper electrode as a mask and forming an upper-layer via and an upper-layer wiring on the structure thus obtained.

The present invention enables manufacture of a semiconductor device with a high yield, and having a thin-film capacitor with low electrode resistance and causing little leak current between upper and lower electrodes. In particular, the present invention provides an MIM capacitor formed in an LSI copper multilayer wiring structure.

BRIEF DESCRIPTION OF THE DRAWINGS

FIGS. 5A to 5H are diagrams for explaining manufacturing processes of a thin-film capacitor according to a third embodiment of the present invention;

DESCRIPTION OF THE PREFERRED EMBODIMENTS

A thin-film capacitor of the present invention uses, for example, a layered structure of a tantalum film and a titanium nitride film as a lower electrode, and uses a monolayer titanium nitride film as an upper electrode.

The present invention is based on a finding that the flatness of the lower electrode surface can be improved by employing a lower electrode structure in which an amorphous or microcrystalline film or a laminate of such films is formed on a polycrystalline film exhibiting high conductivity. When a 140 nm thick titanium nitride film was formed by a sputter-deposition method and the roughness of the surface of the film was analyzed by an AFM method for an area of 1 μm by 1 μm, the difference between a maximum height and a minimum height, or the roughness was 13.6 nm. When a 15 nm thick tantalum film was formed on this 140 nm thick titanium nitride film by a sputtering method, the difference between the maximum and minimum heights was reduced to about 10 nm as measured by the same method.

Figure 1:
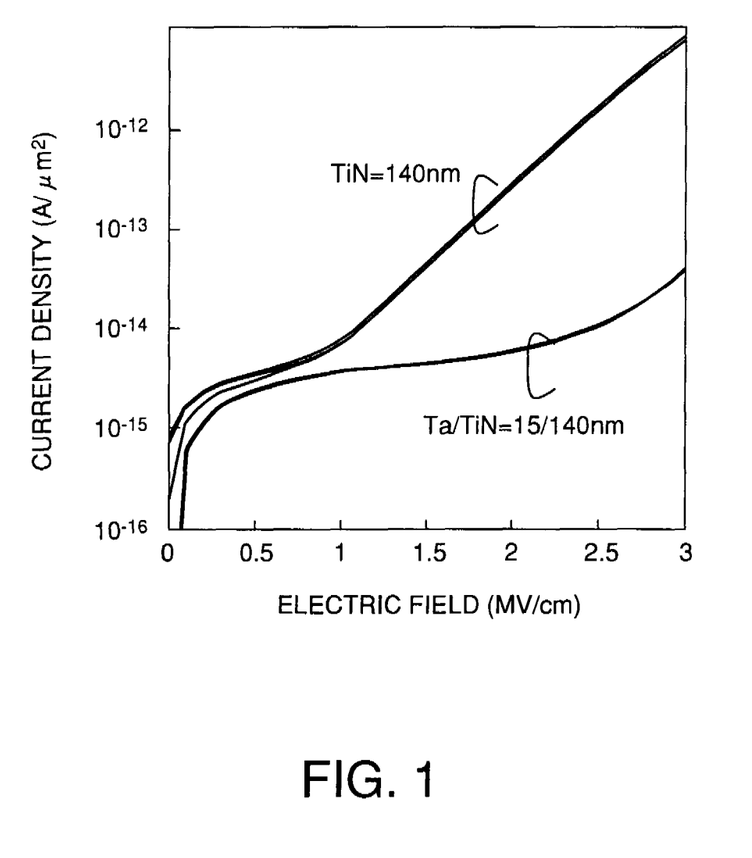
FIG. 1 is a characteristics diagram showing the relationship between current density and electric field, showing that the leakage level of the electrode can be suppressed low by using an amorphous or microcrystalline film, or a laminate of such films.

A 10 nm thick SiN film was formed by a CVD method on each of these two types of lower electrodes (TiN and Ta/TiN), and then a titanium nitride film was formed to a thickness of 100 nm as an upper electrode to define an MIM structure. The upper electrode was shaped into a rectangle of 100 nm by 100 nm and subjected to evaluate electrical characteristics. FIG. 1 shows the results of the evaluation. It can be seen from FIG. 1 that the formation of the tantalum film is able to remarkably reduce the leak current.

Figure 2:
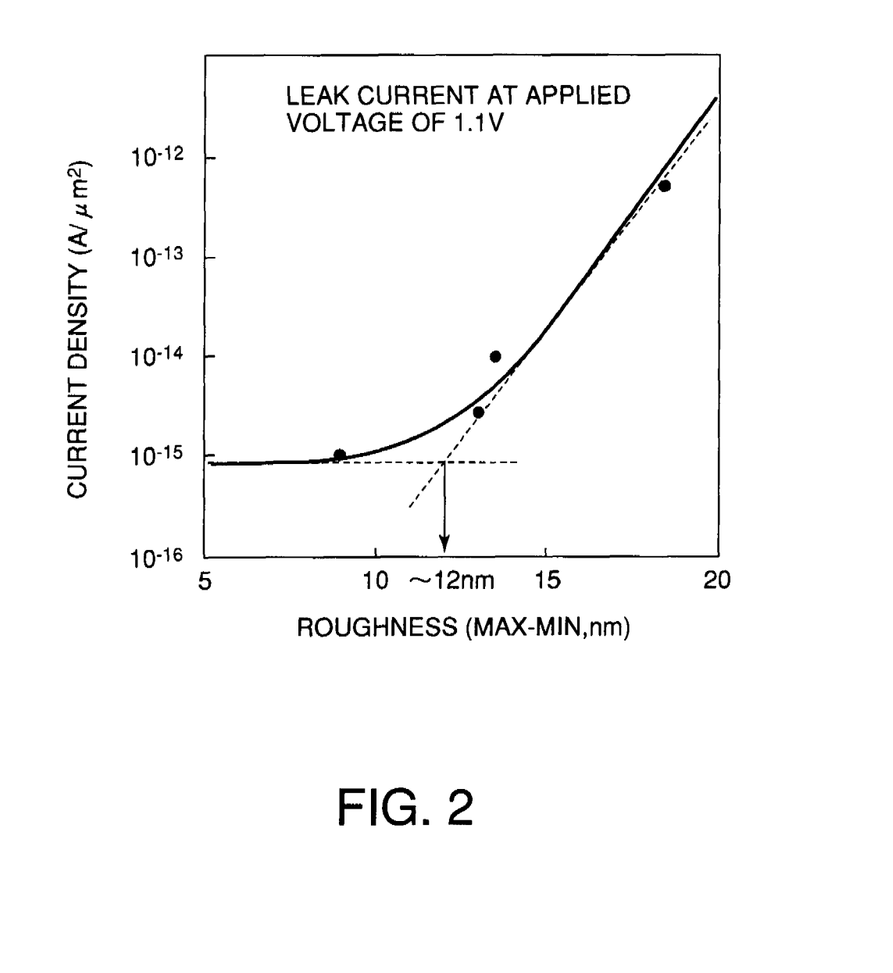
FIG. 2 is a characteristics diagram showing the relationship between surface roughness of a titanium nitride film and leak current.

FIG. 2 shows the results of study of correlation between surface roughness of the titanium nitride film and leak current. The leak current can be suppressed if the roughness can be reduced. Particularly, if the difference between the maximum and minimum heights can be suppressed to a value equivalent to or lower than the thickness of the SiN insulation film, the leak current due to surface roughness can be suppressed effectively. It can be seen from this that the formation of an amorphous or microcrystalline film to planarize the lower electrode surface is very effective to reduce the leak current. Since it is very difficult to strictly measure the thickness of the SiN thin film and measurement error likely occurs, the term "a thickness equivalent to or less than the thickness of the insulation film" should desirably be interpreted as a thickness equal to or less than about 1.2 times the thickness of the capacitive insulation film, including the measurement error.

The advantageous effects of the present invention can be obtained not only by using a tantalum film as the amorphous or microcrystalline film, but also by using a film as long as it has metallic or semiconductive electrical conductivity and excellent flatness, regardless of types, a quantity of films, and film thickness. For example, the amorphous or microcrystalline film may be a nitrogen-doped tantalum film, a tantalum nitride film, or a laminate of a tantalum nitride film and a tantalum film layered in this order or in the reverse order. Further, a carbon-doped amorphous or microcrystalline tantalum film may be used. The metallic film may be any of Zr, Hf, V, Nb, W, Mo, Ni, and Co films, or a nitrogen-doped film or nitrificated film thereof. The atomic species of the metallic film is not limited particularly as long as it has properties of an amorphous or microcrystalline film. Additionally, a multi-component alloy having excellent flatness such as WTi, or a nitride of the multicomponent alloy such as WTiN also may be used.

Several preferred embodiments of the present invention will be described with reference to the accompanying drawings.

[First Embodiment]
First MIM Structure Incorporated in ULSI Wiring

A first embodiment has an MIM structure incorporated in an actual ULSI wiring structure.

Figure 3A:
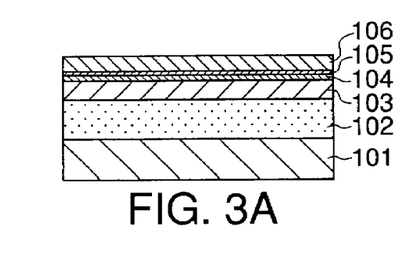
FIGS. 3A to 3O are diagrams for explaining manufacturing processes of a thin-film capacitor according to a first embodiment of the present invention.

As shown in FIG. 3A, a 200 nm thick silicon oxide film 102 is formed on a lower-layer wiring 101 by plasma CVD. Subsequently, a 140 nm thick titanium nitride film 103 and a 15 nm thick tantalum film 104 are formed as a polycrystalline film and an amorphous film, respectively. A 10 nm thick silicon nitride film 105 is then formed as a capacitive insulation film, and a 100 nm thick titanium nitride film 106 is further formed as an upper electrode film. The titanium nitride film 103, the tantalum film 104, and the titanium nitride film 106 can be formed by deposition, using a sputtering method or CVD method. The silicon nitride film 105 also can be formed by depositing using a sputtering method or CVD method.

Figure 3B:
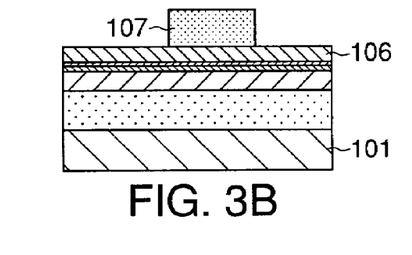
Figure 3C:
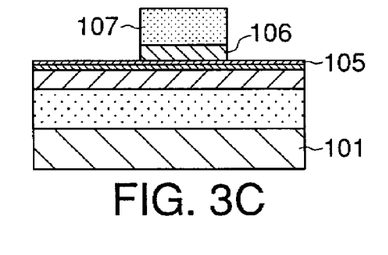
Figures 3D, 3G:
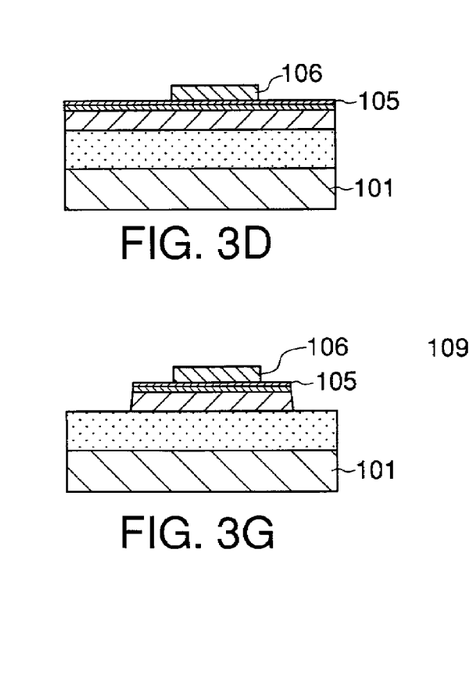
Figures 3E, 3H:
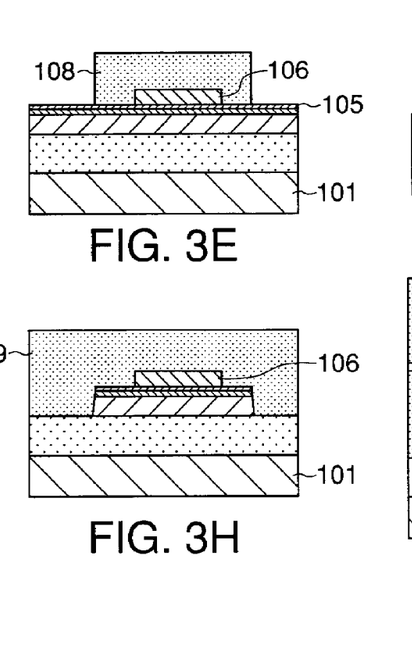

Subsequently, as shown in FIG. 3B, a photoresist 107 is patterned to obtain an upper electrode having desired dimensions. The titanium nitride film 106 is then etched by using the photoresist 107 as a mask as shown in FIG. 3C. The photoresist 107 is peeled off after completion of the etching as shown in FIG. 3D. Subsequently, as shown in FIG. 3E, a photoresist 108 is patterned to obtain a lower electrode having desired dimensions. The photoresist 108 is patterned so as to cover the upper electrode (silicon nitride film 106).

Figure 3F:
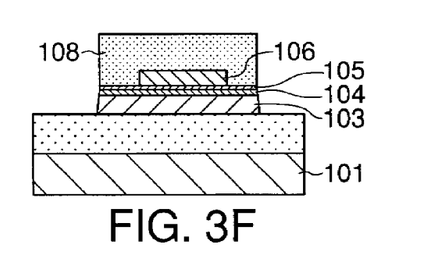
Figure 3I:
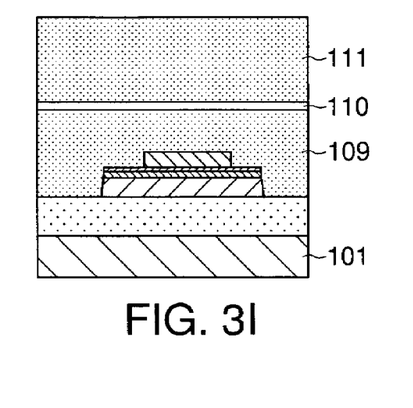

Subsequently, as shown in FIG. 3F, the silicon nitride film 105, the tantalum film 104, and the titanium nitride film 103 are etched by using the photoresist 108 as a mask. The photoresist 108 is peeled off after completion of the etching as shown in FIG. 3G. A 1400 nm thick silicon oxide film 109 defining a via interlayer film is formed by plasma CVD so as to totally cover the MIM structure, and CMP (Chemical Mechanical Polishing) is performed to eliminate the surface roughness (FIG. 3H). A 120 nm thick silicon carbonitride film 110 is formed on the silicon oxide film 109 as a trench stopper by plasma CVD, and then a 1200 nm thick silicon oxide film 111 is formed as a trench interlayer film by plasma CVD (FIG. 3I).

Figure 3J:
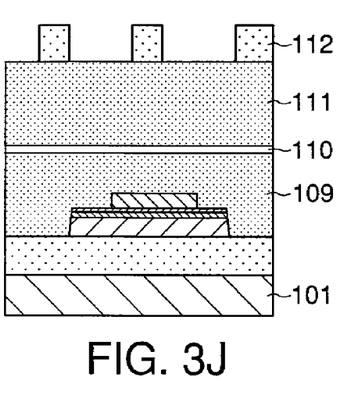
Figure 3K:
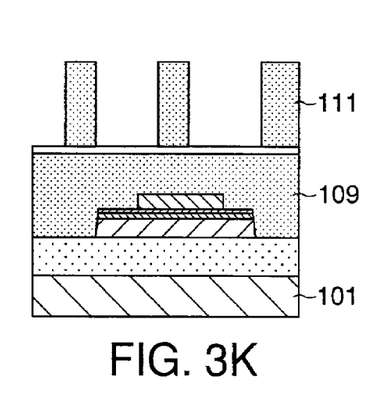
Figure 3L:
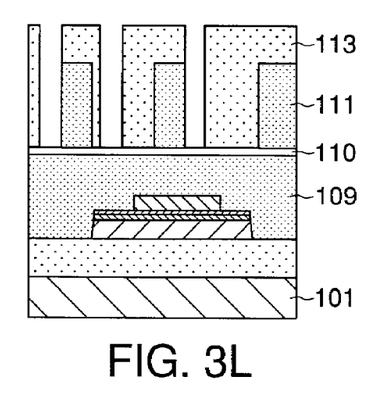
Figure 3M:
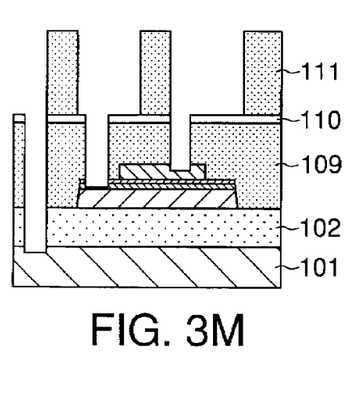
Figure 3N:
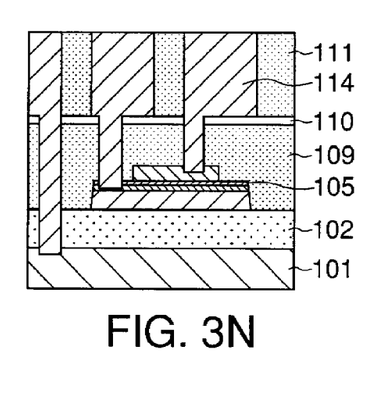
Figure 3O:
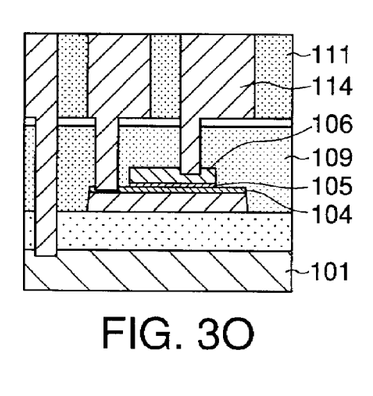

Subsequently, as shown in FIG. 3J, a photoresist 112 is applied on the silicon oxide film 111, and the photoresist 112 is patterned so as to obtain an upper-layer wiring having a desired width. The silicon oxide film 111 is etched with plasma using fluorocarbon gas, and the photoresist 112 is peeled off (FIG. 3K). A photoresist 113 is applied so as to cover the upper-layer wiring pattern, and the photoresist 113 is patterned through a desired upper-layer via (FIG. 3L). The silicon carbonitride film 110, the silicon oxide film 109, and the silicon oxide film 102 are etched with plasma using fluorocarbon gas, and then the photoresist 113 is peeled off (FIG. 3M). After this, a barrier film and a copper film are buried in the trench and the via and the surface is polished by CMP, whereby a contact for the upper and lower wirings is formed and, at the same time, an MIM structure capable of providing contact at the upper-layer wiring 114 is formed (FIG. 3N). In the first embodiment, as shown in FIG. 3O, the MIM structure may be fabricated by etching the silicon nitride film 105 at the same time with the etching of the titanium nitride film 106.

Although a titanium nitride film is mentioned as an example of the polycrystalline film, the present invention is not limited to this but any other film may be used as long as it is compatible with a silicon LSI process and has low resistivity. This is because the polycrystalline film should have a lower specific resistance than the amorphous or microcrystalline film, so that an MIM capacitor is formed, having a lower electrode with a low CR-time constant and having excellent high-frequency responsiveness.

[Second Embodiment]
Second MIM Structure Incorporated in ULSI Wiring

Figure 4A:
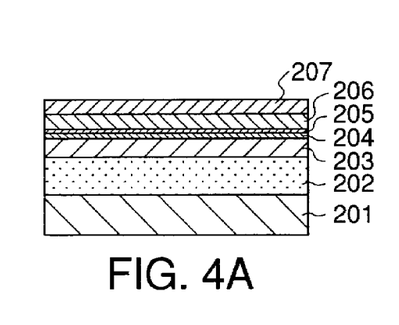
FIGS. 4A to 4R are diagrams for explaining manufacturing processes of a thin-film capacitor according to a second embodiment of the present invention.

One of manufacturing methods for realizing an MIM structure according to the present invention uses a hard mask film. This method will be described with reference to FIGS. 4A to 4R. In the first step, similarly to FIG. 3A, a 200 nm thick silicon oxide film 202 is formed by plasma CVD on a lower-layer wiring 201. Subsequently, a 140 nm thick titanium nitride film 203 and a 15 nm thick tantalum film 204 are formed as a polycrystalline film and an amorphous film, respectively. A 10 nm thick silicon nitride film 205 as a capacitive insulation film is then formed on the tantalum film 204, and a 100 nm thick titanium nitride film 206 is formed as an upper electrode film. Further, as a hard mask film, a 100 nm thick silicon nitride film 207 is formed on the titanium nitride film 206 by plasma CVD (FIG. 4A). The relationship between the hard mask film 207 and the titanium nitride film (upper electrode film) 206 may be combination of materials determined such that the titanium nitride film (upper electrode film) 206 is formed of a material which is difficult to be etched when the hard mask film 207 is etched, while the hard mask film 207 is formed of a material which is difficult to be etched when the titanium nitride film (upper electrode film) 206 is etched.

Figure 4B:
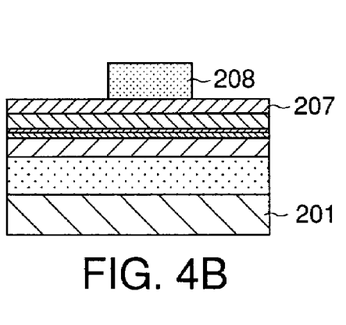
Figure 4C:
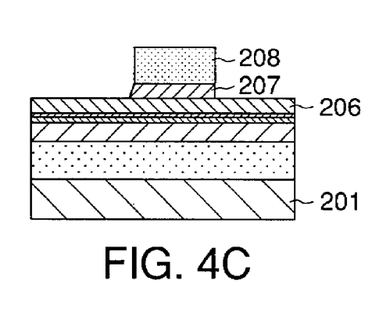
Figure 4D:
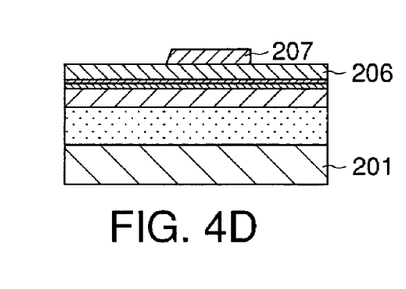
Figure 4E:
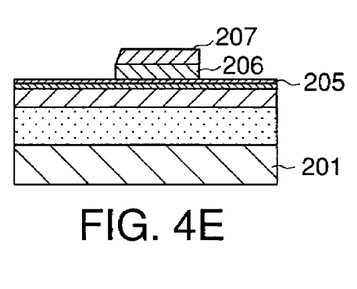

In order to obtain an upper electrode having desired dimensions, a photoresist 208 is patterned as shown in FIG. 4B. Subsequently, as shown in FIG. 4C, the silicon nitride film 207 is etched by using the photoresist 208 as a mask. The photoresist 208 is then peeled off after completion of the etching as shown in FIG. 4D. Subsequently, as shown in FIG. 4E, the titanium nitride film 206 is etched by using the silicon nitride film (hard mask film) 207 as a mask. The use of the hard mask film makes it possible to prevent occurrence of an abnormal shape referred to as "fence". The abnormal shape called fence is produced by an etching product adhered to a side wall when the etching of the titanium nitride film 206 progresses not only to the silicon nitride film 205 but also to the tantalum film 204. The silicon nitride film 207 serving as the hard mask film is able to serve also as a stopper during via etching in a subsequent process step.

Figure 4F:
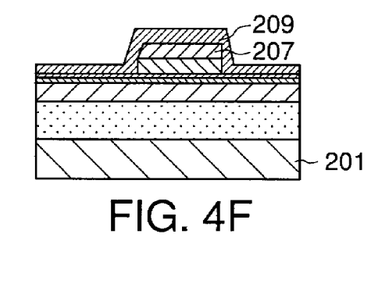

As shown in FIG. 4F, a silicon nitride film 209 is formed as a hard mask film to totally cover the top surface. The relationship between the hard mask film (silicon nitride film) 209 and the titanium nitride film 203 and tantalum film 204 as a lower electrode film may be combination of materials determined such that the titanium nitride film 203 and tantalum film 204 are formed of a material which is difficult to be etched when the hard mask film 209 is etched, while the hard mask film 209 is formed of a material which is difficult to be etched when the titanium nitride film 203 and tantalum film 204 are etched.

Figure 4G:
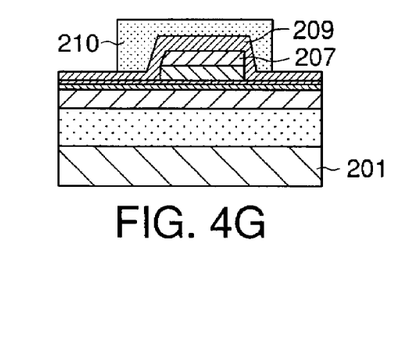
Figure 4H:
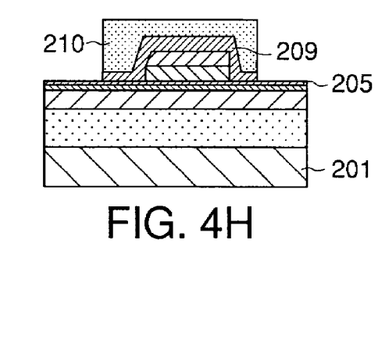
Figure 4I:
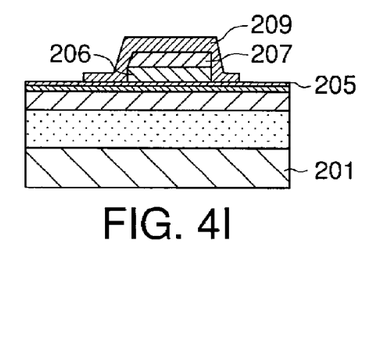

In order to obtain a lower electrode having desired dimensions, a photoresist 210 is patterned as shown in FIG. 4G. The photoresist 210 is patterned so as to cover the upper electrode structure. Subsequently, as shown in FIG. 4H, the silicon nitride film (hard mask film) 209 is etched by using the photoresist 210 as a mask. The photoresist 210 is then peeled off after completion of the etching as shown in FIG. 4I.

Figures 4J, 4K:
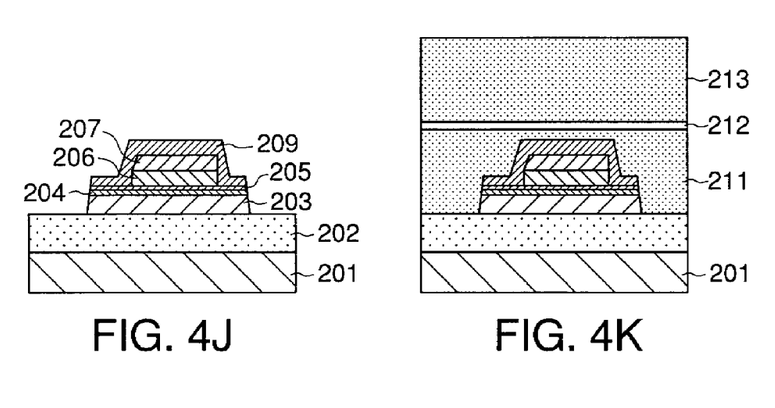

Subsequently, as shown in FIG. 4J, the silicon nitride film 205, the tantalum film 204, and the titanium nitride film 203 are sequentially etched by using the silicon nitride film 20 as a mask. Thus, the usage of the hard mask film for the etching makes it possible to prevent the occurrence of an abnormal shape, so called fence even if an etching product adheres to a side wall during the etching of the tantalum film 204. The silicon nitride film 209 serving as the hard mask film is able to serve also as a stopper during via etching in a subsequent process step.

Figure 4L:
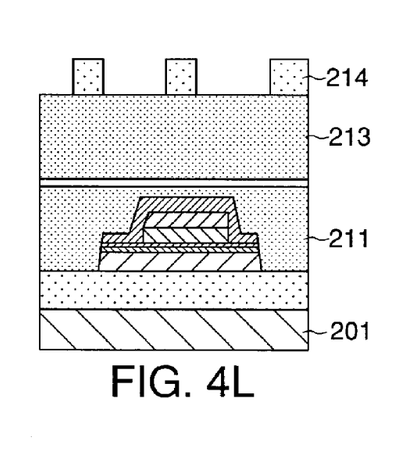
Figure 4M:
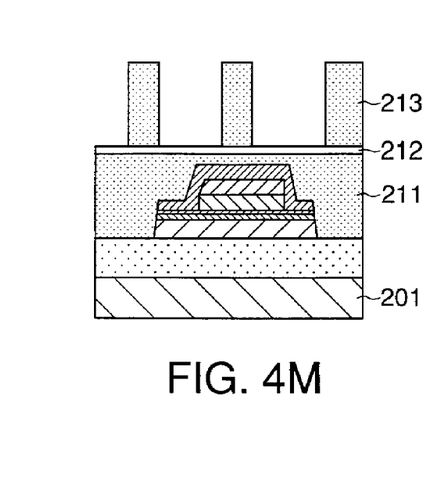
Figure 4N:
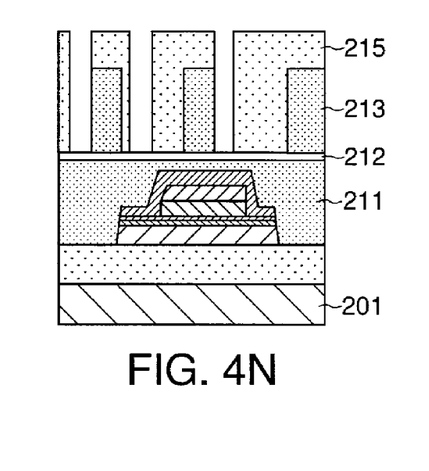
Figure 4O:
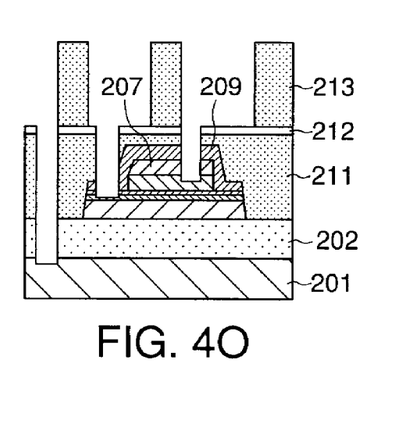
Figure 4P:
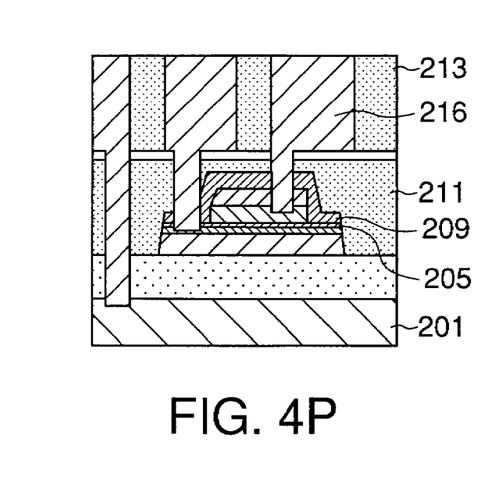

Subsequently, a 1400 nm thick silicon oxide film 211 defining a via interlayer film is formed by plasma CVD all over the top surface so as to cover the MIM structure, and CMP is performed to eliminate the surface roughness. Further, a 120 nm thick silicon carbonitride film 212 is formed as a trench stopper by plasma CVD, and then a 1200 nm thick silicon oxide film 213 is formed as a trench interlayer film by plasma CVD (FIG. 4K). Subsequently, a photoresist 214 is applied and patterned to obtain an upper-layer wiring having a desired width as shown in FIG. 4L. The silicon oxide film 213 is etched with plasma using fluorocarbon gas and the photoresist 214 is peeled off after the etching (FIG. 4M). A photoresist 215 is applied to cover the upper-layer wiring pattern, and the photoresist 215 is patterned through a desired upper-layer via (FIG. 4N). The silicon carbonitride film 212, the silicon oxide film 211, and the silicon oxide film 202 are etched with plasma using fluorocarbon gas, and the photoresist 215 is peeled off after the etching (FIG. 4O). A barrier film and a copper film are buried in the trench and the via and the surface is polished by CMP, whereby a contact for the upper and lower wirings is formed and, at the same time, an MIM structure capable of providing contact at the upper-layer wiring 216 is formed (FIG. 4P).

Figure 4Q:
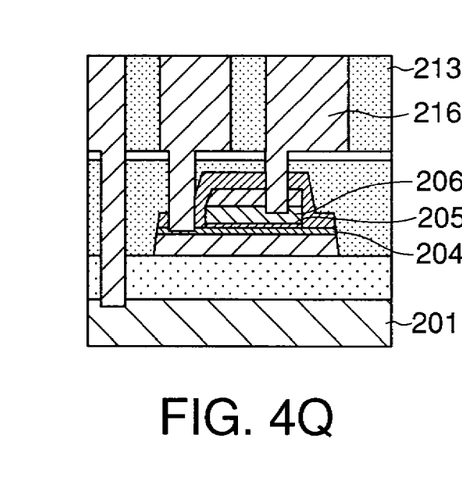
Figure 4R:
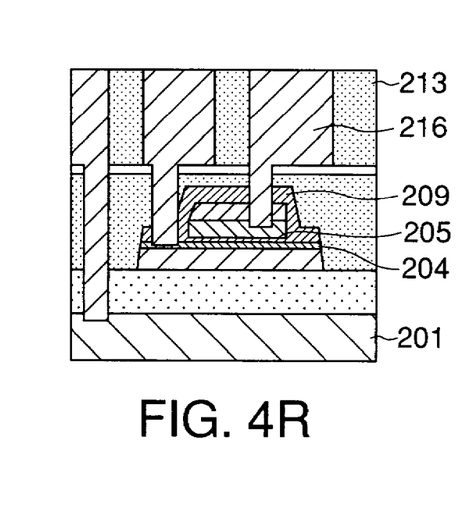

In the second embodiment described above, as shown in FIG. 4Q, the MIM structure may be fabricated by etching the silicon nitride film 205 at the same time with the etching of the titanium nitride film 206. Further, as shown in FIG. 4R, the MIM structure may be fabricated by etching the silicon nitride film 205 at the same time with the etching of the hard mask film (silicon nitride film) 209 in FIG. 4H.

[Third Embodiment]
Lined Lower Electrode Structure

A third embodiment relates to a semiconductor device in which a capacitor having an upper electrode, a capacitive insulation film, and a lower electrode layered in this order from the top is mounted on a wiring, and the semiconductor device is characterized in that the lower electrode of the capacitor is in direct contact with the wiring located under the same.

Figure 5A:
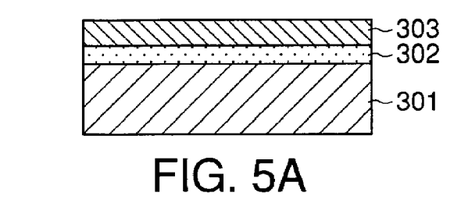
Figure 5B:
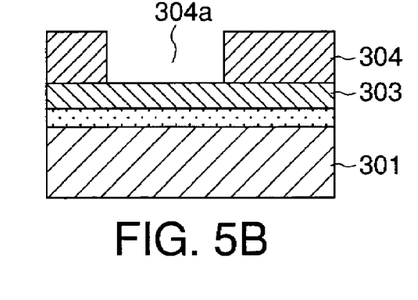

FIGS. 5A to 5H are cross-sectional views showing process steps for realizing the semiconductor device according to the third embodiment. In the first step, as shown in FIG. 5A, a buried Cu wiring 301 is formed. A silicon nitride film or silicon carbonitride film is formed to a thickness of 100 nm as a wiring cap insulation film 302 for preventing oxidation or diffusion of Cu. $SiO_2$ or SiOCH is then deposited to a thickness of 150 nm as a hard mask film 303. A photoresist 304 is then applied, and a lower electrode contact forming pattern 304a is formed by photolithography (FIG. 5B).

Figure 5C:
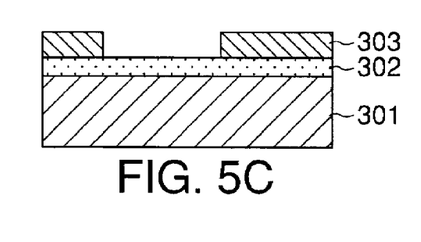

Subsequently, the silicon oxide film (hard mask film) 303 is etched with fluorocarbon plasma or the like by using the photoresist 304 having the pattern 304a formed therein as a mask. During the etching, it is important to stop the etching on the wiring cap insulation film 302 by utilizing the selective characteristics of dry etching. After a same opening pattern as the pattern 304a is formed in the hard mask film 303, the photoresist 304 is removed by ashing to obtain a structure shown in FIG. 5C. Since the surface of the lower-layer Cu wiring 301 is not exposed, the oxidation of Cu by oxygen plasma can be suppressed during the ashing.

Figure 5E:
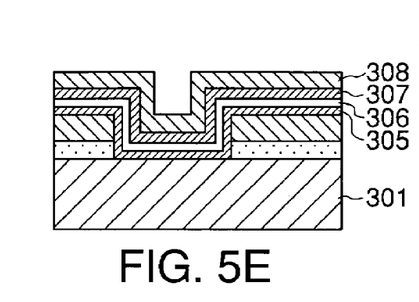

The wiring cap insulation film 302 is then etched by using the opening pattern of the hard mask film 303 as a mask to form an opening pattern reaching the surface of the lower-layer Cu wiring 301 as shown in FIG. 5D. Subsequently, as shown in FIG. 5E, a 30 nm thick titanium nitride film 305 and a 15 nm thick tantalum film 306 are sequentially formed by a sputtering method. Further, a 10 nm thick silicon nitride film 307 is formed by a plasma CVD method, and then a titanium nitride film 308 defining an upper electrode is formed by a sputtering method.

Figure 5F:
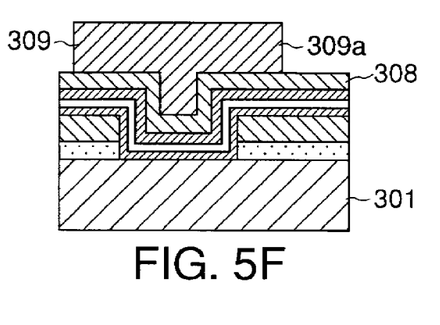
Figure 5G:
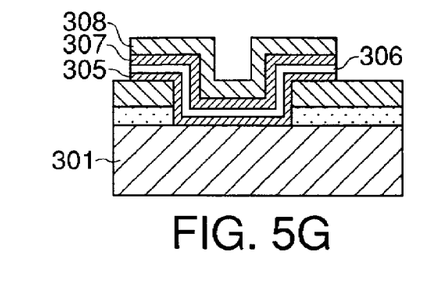

After applying a photoresist 309 on the titanium nitride film 308, an upper electrode pattern 309a is formed by photolithography so as to confine the lower electrode contact region (FIG. 5F). By using the upper electrode pattern 309a as a mask, the titanium nitride film 308, the silicon nitride film 307, the tantalum film 306, and the titanium nitride film 305 are dry etched sequentially in this order (FIG. 5G). Preferably, the titanium nitride films 305 and 308 are etched with chlorine/$BCl_3$ gas, while the silicon nitride film 307 and the tantalum film 306 are etched with fluorocarbon gas plasma. Further, the substrate temperature is preferably set to 50 degrees or higher in order to suppress the adherence of the substance deposited on the side wall during the etching of the tantalum film 306.

Figure 5H:
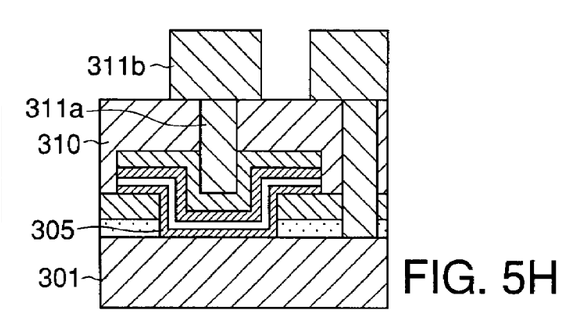

The photoresist 309 is peeled off after the dry etching. An insulation film 310 is deposited, and then an upper-layer via 311a and an upper-layer wiring 311b are formed to provide contact with the thin-film capacitor (FIG. 5H).

According to the third embodiment, the titanium nitride film 305 defining a lower electrode having a columnar structure is planarized by the amorphous or microcrystalline tantalum film 306. This makes it possible to obtain a thin-film capacitor causing little leak current.

Although a titanium nitride film is used for the upper and lower electrodes in the third embodiment, any other material may be used as long as similar effects can be obtained. For example, tantalum nitride, tantalum, tungsten, aluminum, or an alloy may be used. Although a tantalum film is used as the amorphous for microcrystalline film formed for planarization, any other material may be used as long as similar effects can be obtained. For example, a tantalum nitride film, or a laminate of a tantalum nitride film and a tantalum film layered in this order or in the reverse order may be used.

[Fourth Embodiment]

A semiconductor device according to a fourth embodiment is a semiconductor device in which a capacitor having an upper electrode, a capacitive insulation film, and a lower electrode layered in this order from the top is mounted on a wiring, and is characterized in that the lower electrode of the capacitor is buried in a groove formed through the insulation film on the wiring located in the lower layer thereof, to reach this lower-layer wiring, so that the lower electrode is in direct contact with the lower-layer wiring.

Figure 6A:
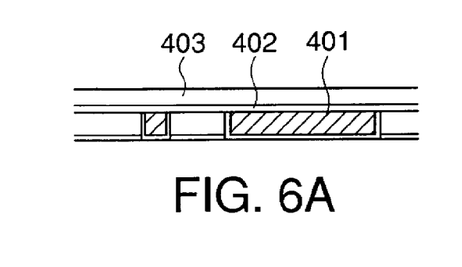
FIGS. 6A to 6I are diagrams for explaining manufacturing processes of a thin-film capacitor according to a fourth embodiment of the present invention.
Figure 6B:
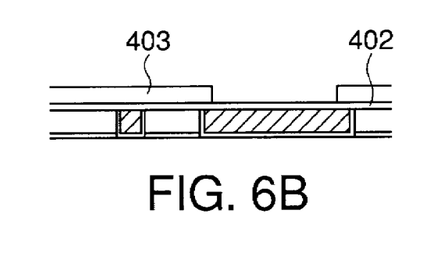

FIGS. 6A to 6I are cross-sectional views showing process steps for realizing the semiconductor device according to the fourth embodiment. In the first step, as shown in FIG. 6A, an SiN or SiCN film is formed to a thickness of 120 nm on a lower-layer wiring 401 primarily composed of Cu so that the SiN or SiCN film defines a wiring cap insulation film 402 for preventing oxidation of the wiring and diffusion of the material forming the wiring. Further, $SiO_2$ or SiOCH is deposited thereon to a thickness of 200 nm as a hard mask film 403. As shown in FIG. 6B, an opening pattern is formed in the hard mask film 403 through photolithography and etching processes. It is important to stop the etching on the wiring cap insulation film 402 by utilizing the selective characteristic of dry etching. When a photoresist is removed by ashing after the formation of the opening pattern in the hard mask film 403, the lower-layer wiring 401 can be prevented from oxidation due to oxygen plasma since the surface of the wiring is not exposed.

Figure 6C:
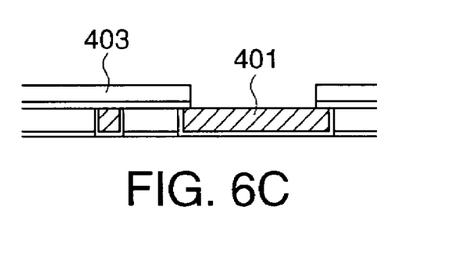
Figure 6D:
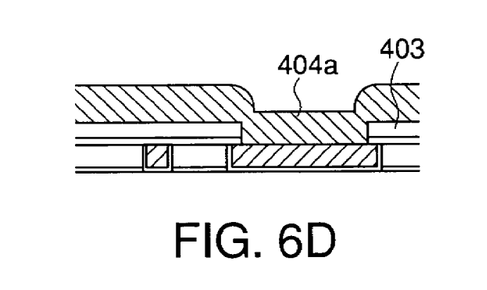
Figure 6E:
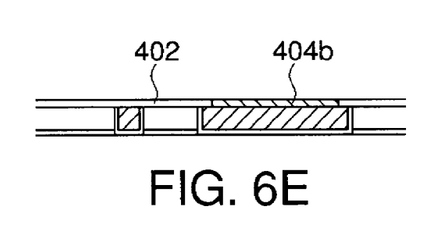

Subsequently, the wiring cap insulation film 402 is etched by using the opening pattern of the hard mask film 403 as a mask to form an opening reaching the surface of the lower-layer wiring 401 as shown in FIG. 6C. Next, as shown in FIG. 6D, TaN is deposited to a thickness of 600 nm by a sputtering method to define a buried-plug lower electrode 404a such that the opening is completely filled therewith. The TaN other than the portion thereof in the opening is removed by a CMP method, whereby a buried lower electrode 404b is formed as shown in FIG. 6E. The material for forming the buried lower electrode 404b is not limited to TaN, but any other material exhibiting metallic or semiconductive electrical conductivity such as Ta, Ti, W, Al, Cu, Si, or an alloy or nitride thereof may be used. The residual hard mask may be removed completely until the wiring cap insulation film 402 is exposed. The total of the thickness of the residual hard mask film 403 and the thickness of the wiring cap insulation film 402 defines the thickness of the lower electrode 404b. FIG. 6E shows an example in which the hard mask film 403 has been removed until the wiring cap insulation film 402 is exposed.

In this manner, the buried lower electrode 404b can be formed in direct contact with the lower-layer wiring 401. If Cu, which is a soft material, is used as the wiring material, a phenomenon called dishing tends to occur during the CMP process, leading to formation of a depressed shape in a central part if the pattern has a large area. Therefore, it is difficult to form a large-area wiring pattern of Cu. In contrast, using TaN, which is a hard material, such dishing is difficult to occur. Therefore, the fourth embodiment of the present invention is characterized in that a flat surface can be obtained even on a pattern having a relatively large area.

Figure 6F:
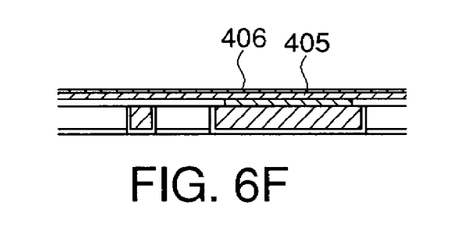

Subsequently, as shown in FIG. 6F, a 100 nm thick TiN film is formed by a reactive sputtering method to define a principal lower electrode layer 405 composed of polycrystals and exhibiting metallic electrical conductivity, which forms a gist of the present invention. Additionally, a 10 nm thick TaN layered film is also formed by a reactive sputtering method to define a conductive film 406 for planarization of the surface roughness of the lower electrode layer 405. The material for the principal lower electrode layer 405 may be any material as long as it has a polycrystalline structure and has metallic or semiconductive electrical conductivity. On the other hand, the material for the conductive film 406 for planarization of the surface roughness may be any material as long as it has an amorphous or microcrystalline structure, exhibits metallic or semiconductive electrical conductivity, and has a higher resistivity than the material forming the lower electrode 405. Subsequently, a 10 nm thick SiN film is formed by a plasma CVD method on the amorphous conductive film 406 to define a capacitive insulation film 407.

Figure 6G:
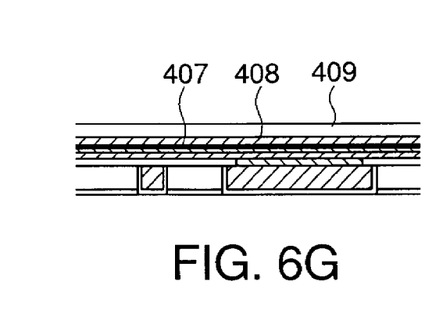

Next, TiN is deposited by a reactive sputtering method as an upper electrode 408. An SiN or SiCN insulation film is then formed on the upper electrode 408 as a capacitive cap insulation film 409 similar to the insulation film 402 formed on the lower-layer wiring 401. Thus, formation of a capacitive layered film as shown in FIG. 6G is completed.

Figure 6H:
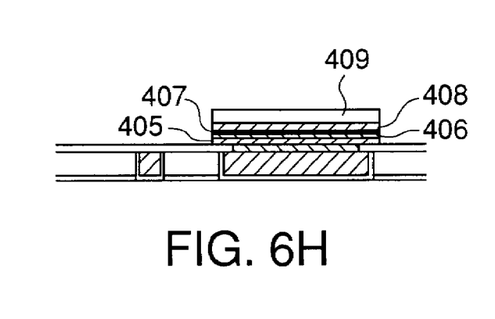
Figure 6I:
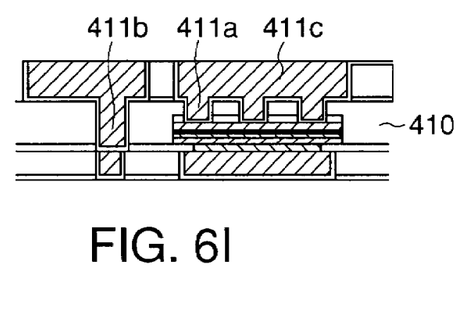

Subsequently, as shown in FIG. 6H, the capacitive cap insulation film 409, the upper electrode 408, the capacitive insulation film 407, the conductive film 406, and the lower electrode layer 405 are patterned into a shape confining the lower electrode. The patterning of the capacitor may be performed by etching the capacitive cap insulation film 409 by using a photoresist as a mask, ashing the photoresist and then etching the remaining multilayer film by using the capacitive cap insulation film 409 as a mask. After completion of the dry etching, an insulation film 410 is deposited, and then an upper electrode contact 411a, an upper-layer via 411b, and an upper-layer wiring 411c are formed to provide contact with the thin-film capacitor (FIG. 6I).

[Fifth Embodiment]

Figure 7:
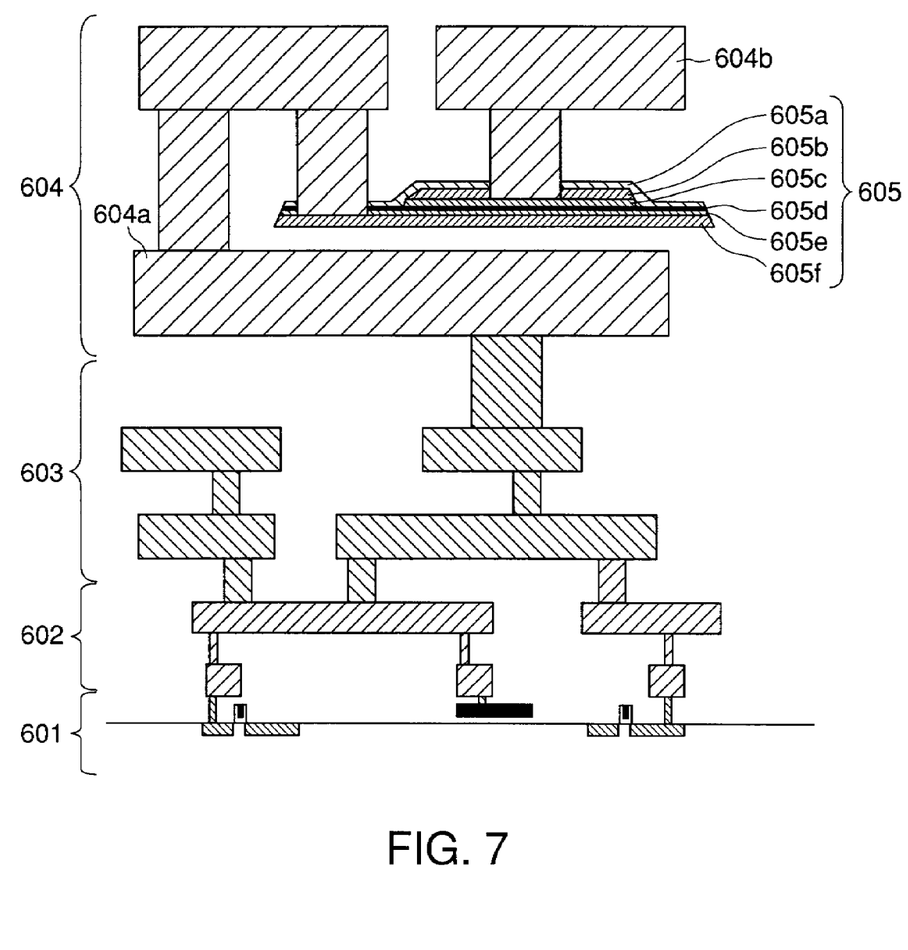
FIG. 7 is a diagram showing a wiring structure having a thin-film capacitor according to a fifth embodiment of the present invention incorporated therein.

FIG. 7 shows an example of a structure according to a fifth embodiment of the present invention, in which a capacitor is mounted on a high-performance and high-speed processing semiconductor device for the purpose of decoupling. Some high performance and high-speed processing semiconductor devices have a multilayer wiring structure consisting of as many as ten or more layers. Such a multilayer wiring structure includes a lowermost wiring layer region 602 having a short pitch and a short average wiring distance per line and composed of a first layer directly on a transistor layer 601 or a plurality of layers including this first layer. The multilayer wiring structure also includes an intermediate wiring layer region 603 having a larger pitch and a longer average wiring distance per line than the lowermost wiring layer region 602 and formed above the lowermost wiring layer region 602. The multilayer wiring structure further includes an uppermost wiring layer region 604 having a larger pitch and a longer average wiring distance per line than the intermediate wiring layer region 603 and composed of a single layer or a plurality of layers formed above the intermediate wiring layer region 603. Further, a pad (not shown) is provided on the uppermost wiring layer to be connected to an external circuit.

In general, the lowermost wiring layer region 602 consisting of a single layer or a plurality of layers is often used to connect between local transistors and hence is referred to as local wiring. The intermediate wiring layer region 603 is often used to connect between circuit blocks having specific functions and hence is referred to as semiglobal wiring. The uppermost wiring layer region 604 is often used for power supply or clock distribution and is referred to as global wiring.

In the local wiring layer region 602 having a small inter-wiring pitch as described above, the inter-wiring capacity is increased, which possibly causes delay in signal propagation. Therefore, the wiring layers are insulated from each other by using an insulation film formed of a porous or organic material having low permittivity. The material having low permittivity as used herein means a material having a specific permittivity of 3.0 or less. As recent semiconductor devices have been made finer and finer, a wiring structure using a low permittivity material is employed also for a semiglobal wiring in such devices. Since a global wiring is designed to have a large wiring pitch so that a large capacity of current can be supplied, the effect of the inter-wiring capacity on signal propagation becomes insignificant. Thus, a hard material such as silicon oxide is used for the global wiring for the purpose of supporting the strength of the wiring structure or providing high reliability. A metallic material primarily composed of copper having low resistance is used as the wiring material forming the multilayer wiring structure in order to suppress the delay in signal propagation. While a metallic material primarily composed of aluminum is used for a pad for connection to an external circuit, this material may be used as an additional wiring layer. In this case, one more wiring layer primarily composed of aluminum exists on the wiring region of the multilayer wiring structure primarily composed of copper.

A capacitor for decoupling is buried between a supply voltage line and a ground line of a power supply wiring. Accordingly, as shown in FIG. 7, a capacitor 605 is inserted in the global wiring layer region. The capacitor 605 is for example composed of a hard mask film 605a for forming a lower electrode pattern, a hard mask film 605b for forming an upper electrode pattern, an upper electrode 605c, a capacitive insulation film 605d, an amorphous film 605e for planarization of a lower electrode, and a lower electrode 605f. The capacitor structure according to the present invention is not limited to this structure, and any other structure may be employed as long as it has an amorphous or microcrystalline thin film on a polycrystalline lower electrode. The capacitive insulation film may be formed for example of an SiN film having a thickness of 10 nm, but the present invention is not limited to this. Any other film may be used as long as it has a capacity value per unit area of 3 fF/$\mu$m$^2$ or more but 25 fF/$\mu$m$^2$ or less. If the capacity value is less than 3 fF/$\mu$m$^2$, it becomes difficult to obtain the effects of the present invention since the thickness of the capacitive insulation film is large enough. If the capacity value exceeds 25 fF/$\mu$m$^2$, however, increase of leak current is observed due to the reduction of the absolute thickness of the capacitive insulation film.

When an element denoted by 604a in FIG. 7 is a supply-voltage supplying wiring, an element denoted by 604b is a ground wiring. When the element 604a is a ground wiring, the element 604b is a supply-voltage supplying wiring. Although, in the fifth embodiment, each of the local, semi-global, and global wiring regions is described as being composed of two layers, the number of the layers in the respective regions is not limited to two, but may be one, or three or more. Further, the semiglobal wiring itself may be formed into a layered structure having a plurality of layers, and the overall wiring layer structure may have four or more layers.

[Sixth Embodiment]

Figure 8:
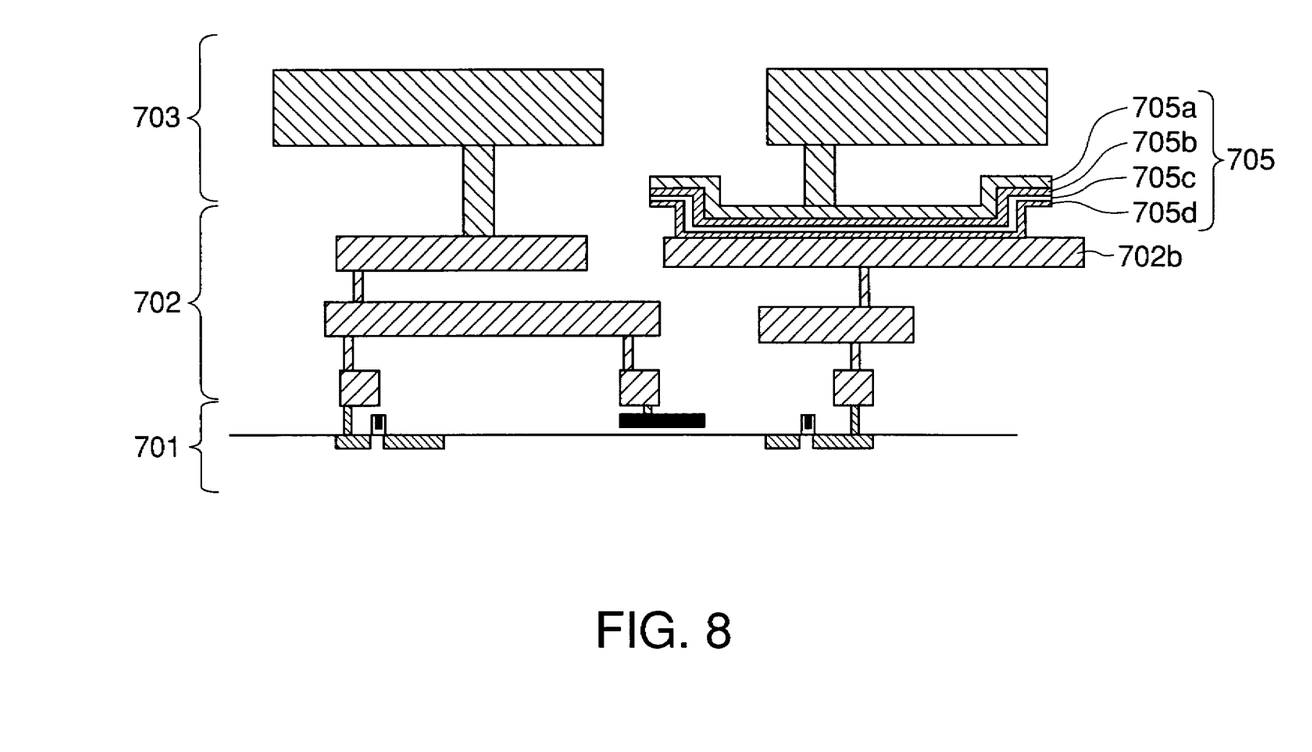
FIG. 8 is a diagram showing a wiring structure having a thin-film capacitor according to a sixth embodiment of the present invention incorporated therein.

FIG. 8 shows an example of a structure according to a sixth embodiment of the present invention, in which a decoupling capacitor is incorporated in a semiconductor device designed to reduce the cost and power consumption. To achieve the cost reduction, it is vital to reduce the number of wiring layers. Therefore, the sixth embodiment employs a two-tier wiring layer structure instead of the three-tier wiring layer structure as described in the fifth embodiment. The two-tier wiring layer structure is composed of a local wiring layer region 702 having a single wiring layer or a plurality of wiring layers arranged directly on a transistor formation region 701, and a global wiring layer region 703 formed above the local wiring layer region 702. Since the semiconductor device operates with low power consumption, the global wiring layer may be formed with a relatively narrow wiring pitch, and may be formed of a single layer. Accordingly, the decoupling capacitor 705 is inserted between the uppermost wiring layer of the local wiring layer region 702 composed of a plurality of layers and the global wiring layer 703 composed of a single layer. The decoupling capacitor 705 is composed of an upper electrode 705a, a capacitive insulation film 705b, an amorphous or microcrystalline thin film 705c for planarization of the lower electrode surface, and a lower electrode 705d formed of polycrystals. The lower electrode 705d is physically in contact with the local wiring 702b through an opening. The structure of the decoupling capacitor to be inserted herein is not limited to this structure described above. Any other structure may be applied as long as it has an amorphous or microcrystalline thin film on a polycrystalline lower electrode.

Although FIG. 8 shows a three-layered local wiring layer region, the local wiring layer region may be formed by a single layer, two layers, or four or more layers. Although the global wiring layer region is shown as a single layer structure, it may be formed by two or more layers. The structure according to the sixth embodiment has been described as a two-tier structure consisting of a local wiring layer region and a global wiring layer region for the purpose of cost reduction. However, if necessary, a semiglobal wiring layer region may be provided between these wiring layer region. Also, the capacitor 705 may be inserted between the lowermost layer of the global wiring layer region and the uppermost layer of the semiglobal wiring layer region.

[Seventh Embodiment]

Arrangement of a capacitor is crucial when forming a semiconductor device for performing analog or RF signal processing. Functions of a circuit for performing this type of signal processing are significantly influenced not only by capacitive functions of a capacitor but also by parasitic resistance or parasitic inductance caused by electrodes, wirings or vias. For reducing these parasitic components, it is necessary to minimize the distance between elements or the number of vias. The capacitor is therefore required to be arranged in a lower layer region close to the transistor. The capacitor structure described in the third embodiment enables utilization of a low resistance wiring material as an effective lower electrode, and is thus able to minimize the parasitic resistance of the electrode.

Figure 9:
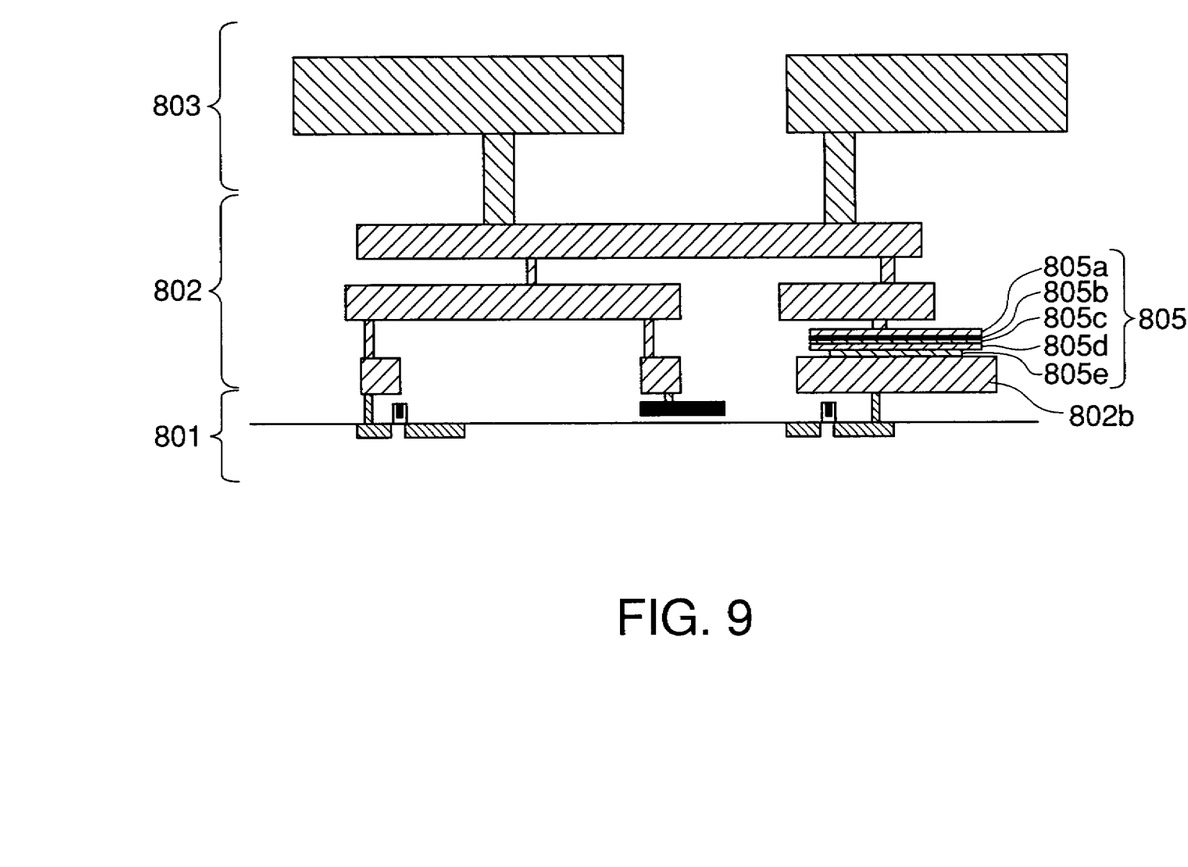
FIG. 9 is a diagram showing a wiring structure having a thin-film capacitor according to a seventh embodiment of the present invention incorporated therein.

FIG. 9 shows a structure of a semiconductor device according to a seventh embodiment of the present invention in cross section. According to the seventh embodiment, a decoupling capacitor 805 is formed within a local wiring layer 802 formed directly on a transistor formation layer 801 and composed of a plurality of layers, so that the capacitor is able to fully exert its functions. The decoupling capacitor 805 is composed of an upper electrode 805a, a capacitive insulation film 805b, an amorphous or microcrystalline thin film 805c for planarization of the lower electrode surface, a lower electrode 805d comprised of polycrystals, and a conductive plug 805e formed in an insulation film formed on the lower-layer wiring. The lower electrode 805d is physically in contact with the local wiring 802b through the conductive plug 805e. However, the structure of the decoupling capacitor to be inserted herein is not limited to the structure described above. Any other structure may be applied as long as it has an amorphous or microcrystalline thin film on a polycrystalline lower electrode.

As described above, the lower electrode 805d is physically in contact with the lower-layer low-resistance wiring through the conductive plug 805e buried in the insulation film formed on the lower-layer low-resistance wiring. This makes it possible to significantly reduce the effective resistance of the electrode and thus to minimize the thickness of the electrode film. As a result, the total film thickness including the thickness of the thin film 805c inserted on the lower electrode 805d for planarization of the electrode surface can be reduced to about 10 to 50 nm. It is very advantageous to reduce the thickness of the capacitor in this manner when inserting the capacitor into a local wiring layer in which a distance between different wiring layers is as small as 100 to 200 nm.

Although the seventh embodiment shows an example of a structure composed of a three-layered local wiring layer region 802 and a single-layered global wiring layer region 803, the wiring layer structure is not limited to this. For example, the local wiring layer region may be composed of a single layer, two layers, or four or more layers. The global wiring layer regions also may have two or more layers. Further, a semiglobal wiring layer region composed of a single layer or a plurality of layers may be provided between the local wiring layer region and the global wiring layer region. Further, the location of arrangement of the capacitor is not limited to within the local wiring layer region. The capacitor may be arranged between the local wiring layer region and the semiglobal wiring layer region, or in the semiglobal wiring layer region.

What is claimed is:

1. A semiconductor device having a capacitive structure formed by layering a lower electrode, a capacitive insulation film, and an upper electrode in order on a wiring or conductive plug, the semiconductor device comprising, as the capacitive structure, a thin-film capacitor having a lower electrode structure comprising:

a polycrystalline film; and an amorphous or microcrystalline film formed on the polycrystalline film or a laminate of amorphous and microcrystalline films formed on the polycrystalline film, wherein the upper electrode is smaller in dimension than the lower electrode structure in the thin-film capacitor, wherein the semiconductor device further comprises a first hard mask film which covers only the upper electrode, a second hard mask film which covers the first hard mask film and side surfaces of the upper electrode and the first hard mask film, and the capacitive insulation film has a capacitance per unit area between 3 $fF/\mu m^2$ and 25 $fF/\mu m^2$.

2. The semiconductor device according to claim 1, wherein the amorphous or microcrystalline film in the lower electrode structure of the thin-film capacitor has a layered structure composed of two or more layers.

3. The semiconductor device according to claim 2, wherein the polycrystalline film of the thin-film capacitor has a greater thickness than that of the amorphous or microcrystalline film or the laminate structure thereof.

4. The semiconductor device according to claim 1, wherein the magnitude of roughness of the surface of the lower electrode structure of the thin-film capacitor is equal to or less than the thickness of the capacitive insulation film.

5. The semiconductor device according to claim 1, wherein the amorphous or microcrystalline film in the thin-film capacitor is a tantalum film.

6. The semiconductor device according to claim 1, wherein the amorphous or microcrystalline film in the thin-film capacitor is a nitrogen-containing tantalum film or a tantalum nitride film.

7. The semiconductor device according to claim 1, wherein the polycrystalline film in the thin-film capacitor is a titanium nitride film.

8. The semiconductor device according to claim 1, wherein the upper electrode in the thin-film capacitor is a titanium nitride film.

9. The semiconductor device according to claim 1, wherein the capacitive insulation film in the thin-film capacitor is a silicon nitride film or a film primarily composed of silicon nitride.

10. A semiconductor device having a multilayer wiring structure, comprising the thin-film capacitor according to claim 1 formed between a power supply line and a ground line in the multilayer wiring structure.

11. The semiconductor device according to claim 10, wherein an interlayer insulation film forming at least one layer of the multilayer wiring structure contains an insulation material having a permittivity of 3.0 or less.

12. A semiconductor device having a multilayer wiring structure, comprising the thin-film capacitor according to claim 1 arranged between any wiring layers vertically adjacent to each other.

13. The semiconductor device according to claim 12, wherein an interlayer insulation film forming at least one layer of the multilayer wiring structure contains an insulation material having a permittivity of 3.0 or less.

14. The semiconductor device according to claim 12, wherein a wiring composed primarily of aluminum is formed in an uppermost layer, and a multilayer copper wiring is formed in the lower layer thereof.

15. The semiconductor device according to claim 14, wherein an interlayer insulation film forming at least one layer of the multilayer wiring structure contains an insulation material having a permittivity of 3.0 or less.

* * * * *